United States Patent [19]

Phipps

[11] 4,419,586
[45] Dec. 6, 1983

[54] SOLID-STATE RELAY AND REGULATOR

[75] Inventor: John P. Phipps, Phoenix, Ariz.

[73] Assignee: Motorola, Inc., Schaumburg, Ill.

[21] Appl. No.: 296,756

[22] Filed: Aug. 27, 1981

[51] Int. Cl.³ ............................................. G02B 27/00
[52] U.S. Cl. ..................................... 250/551; 307/311
[58] Field of Search .......................... 250/214 R, 551; 307/311; 357/19

[56] References Cited

U.S. PATENT DOCUMENTS

| | | | |
|---|---|---|---|
| 3,911,269 | 10/1975 | Hart et al. | 307/311 |
| 4,096,382 | 6/1978 | Numata et al. | 250/214 A |
| 4,158,144 | 6/1979 | Krause | 250/551 |
| 4,165,471 | 8/1979 | Ahrenkeil | 250/211 J |
| 4,166,224 | 8/1979 | Hutson | 357/30 |
| 4,181,863 | 1/1980 | Parker | 307/311 |
| 4,227,098 | 10/1980 | Brown et al. | 307/311 |
| 4,303,831 | 12/1981 | El Hamamsy | 250/551 |
| 4,307,298 | 12/1981 | El Hamamsy et al. | 250/551 |
| 4,323,799 | 4/1982 | King | 307/311 |

Primary Examiner—David C. Nelms
Attorney, Agent, or Firm—Robert M. Handy

[57] ABSTRACT

An improved solid state relay and regulator having reduced turn-off time, analog or digital input, and analog or digital output, is obtained by using a depletion JFET as a variable resistance discharge path for a gate of a power MOSFET switching device wherein the gate is charged by a first set of photovoltaic cells optically coupled to but electrically isolated from an LED input. A second set of photovoltaic cells responsive to the same or a separate LED input hold the JFET in an Off state while the MOSFET gate is energized. Variable output and AND logic are obtained.

11 Claims, 4 Drawing Figures

SOLID-STATE RELAY AND REGULATOR

BACKGROUND OF THE INVENTION

1. Field of the Invention

This invention relates to an improved solid-state relay or regulator having no moving parts and, more particularly, to an improved circuit and opto-electronic semiconductor device which provides electrical isolation but optical coupling between an input current and an output current conducting path, wherein the impedance of the output path varies in response to the input current.

2. Description of the Prior Art

There is an increasing need for solid-state devices without moving parts which can replace electro-mechanical relays and regulators which regulate or switch current flow in a power circuit in response to a mechanically coupled but electrically isolated control current. As used herein, the word relay includes devices having a limited number of impedance states, e.g., either off or on, high or low, etc., as well as devices which have a continuously variable impedance, e.g. regulators. Electro-optical devices when mated with photo-sensitive diodes or transistors can perform this function as a solid state relay or regulator. In this case, the input and output circuits are optically rather than mechanically coupled, and there are no moving parts. Such a device has been described in U.S. Pat. No. 4,227,098 in which a light emitting diode (LED) is coupled to an MOS field effect transistor (MOSFET) by means of a series string of photovoltaic diodes. Energizing the LED causes the impedance between the source-drain terminals of the MOSFET to vary over a wide range, turning on or off, much as does a mechanical relay.

An alternative embodiment is described in U.S. Pat. No. 4,166,224 wherein an LED and photovoltaic diode string combination is used to energize a thyristor so that it can be switched into the on-state.

A significant deficiency of the prior art devices is their relatively slow switching speed compared to that normally obtainable from semiconductor devices. For example, the device of U.S. Pat. No. 4,227,098 is described as having turn-on and turn-off times of approximately one millisecond.

Accordingly, it is an object of this invention to provide an improved optically coupled solid-state relay in which the switching time, especially the turn-off time is reduced.

It is further an object of this invention to provide an improved optically coupled solid-state relay in which the switching time, especially the turn-off time is reduced without deleterious effect on the output voltage of the photovoltaic diode string coupling the LED to the output transistor.

It is an additional object of this invention to provide a discharge resistance of varying value; having a high value when light is being absorbed, and a low value when light is not being absorbed.

It is a further object of this invention to provide a variable discharge resistance in the form of an active pull-down device which is driven by a second photovoltaic diode string optically coupled to one or more input light sources such as LED's.

It is yet an additional object of this invention to provide a solid-state relay in which two input circuits exist, one of which, when energized, acts to turn the relay on and the second of which, when energized, acts to override the influence of the first circuit and turn the solid state relay off or place it in an intermediate impedance state.

SUMMARY OF THE INVENTION

These and other objects and advantages are achieved in accordance with the present invention wherein, according to a first aspect of the invention, there is provided a first photovoltaic means for producing a first control voltage in response to a light input, this first control voltage being applied to the control terminal of a power field effect transistor so as to cause a change in the state of impedance between the output (source-drain) terminals of the power field effect transistor, and wherein there is provided a second discharge field effect transistor of a depletion type or equivalent whose control terminal is coupled to a second photovoltaic means for producing a second control voltage in response to light and whose output (source-drain) terminals are connected to the control terminal and reference terminal of the power field effect transistor so as to provide across the control and reference terminal of the power field effect transistor a variable impedance which is high when light is impinging on the second photovoltaic means and low when the light is removed.

According to a yet further aspect of the invention, the first and second photovoltaic means for generating the first and second control voltages for the power field effect transistor and the discharge field effect transistor respectively are provided by series-connected strings of photovoltaic diodes.

According to a still further aspect of the invention, the photovoltaic diode strings which supply control voltages, respectively, to the power field effect transistor and the discharge field effect transistor are so arranged that the control voltages supplied to the respective transistors are of opposite polarity.

The above, and other objects, features, and advantages of the present invention will be more clearly understood from the following detailed description taken in conjunction with the accompanying drawings.

DETAILED DESCRIPTION OF THE DRAWINGS

Figure 1A:
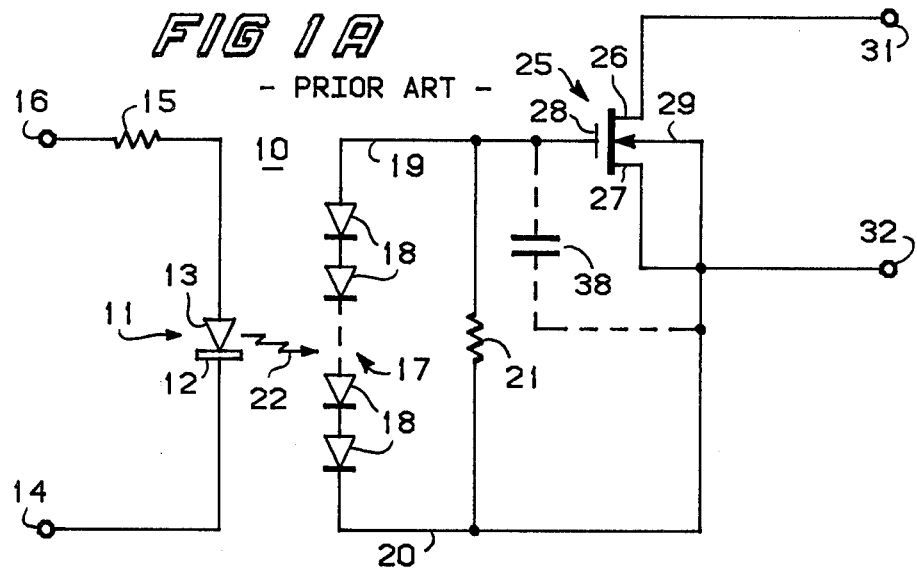
FIG. 1A is a schematic diagram of one embodiment of a solid-state relay in accordance with the prior art.

Referring to FIG. 1A, solid state relay 10 of the prior art comprises light-emitting diode 11 having cathode 12 and anode 13, optically coupled to string or array 17 of photovoltaic diodes 18 connected in series-aiding relationship between a pair of terminals 19 and 20, wherein terminal 19 is connected to the anode of the photovoltaic diode at one end of the series string and terminal 20 is connected to the cathode of the photovoltaic diode at the other end of the series string. Power MOSFET 25 has current-carrying terminals 26 (drain) and 27

(source), reference electrode 29 coupled to the substrate, and control (gate) terminal 28. Control current input terminals 14 and 16 are provided for coupling to light emitting diode (LED) 11. Anode 13 of LED 11 is connected through current limiting resistor 15 to terminal 16. Cathode 12 of LED 11 is connected to terminal 14. Photovoltaic diode array 17 is arranged so as to intercept light 22 being emitted by LED 11. Terminal 19 of diode string 17 is connected to gate 28 of transistor 25. Terminal 20 of photodiode string 17 is connected to reference terminal 29 of transistor 25 and to current carrying terminal 27 (source). Output terminals 31, 32 are connected, respectively, to current carrying terminals 26, 27. Fixed shunt discharged resistance 21 is provided between control (gate) electrode 28 and reference electrode 29 of MOSFET 25 to discharge internal gate capacity 38 of MOSFET 25. The circuit arrangement of FIG. 1A is suitable for use when the solid state relay is conducting substantially direct current between terminals 31, 32.

Figure 1B:
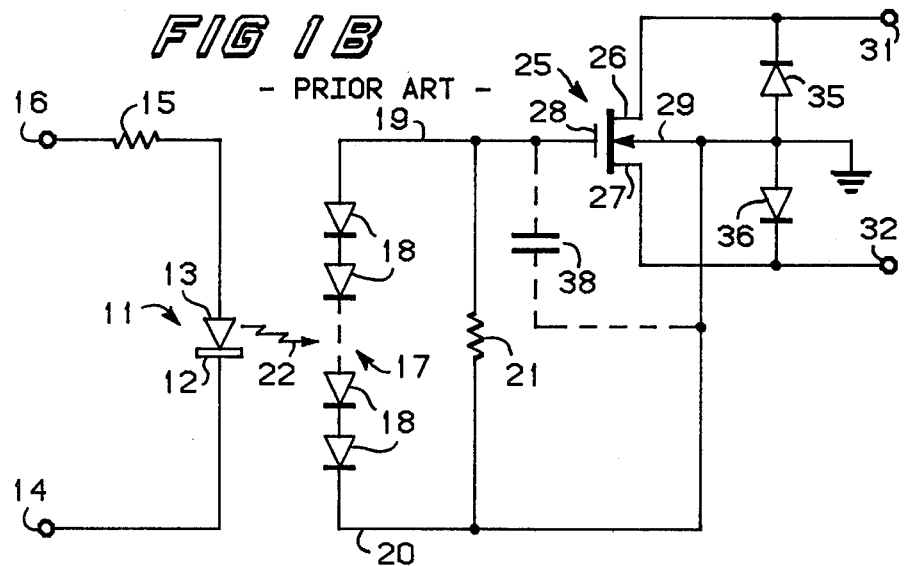
FIG. 1B is a schematic diagram of another embodiment of a solid-state relay in accordance with the prior art.

FIG. 1B is an alternative embodiment of FIG. 1A according to the prior art in which reference terminal 29 of transistor 25 is connected to current-carrying terminals 26 and 27 by means of diodes 35 and 36, the common point therebetween serving as ground for the external circuit. This arrangement is suitable for usage where substantially alternating current will be conducted between terminals 31 and 32.

The following is a brief description of the operation of the prior art circuit. A control signal current applied to terminals 14 and 16 causes LED 11 to emit light 22 which falls on photovoltaic diode string 17, which in turn generates a voltage which appears at terminals 19–20. This voltage also appears across resistor 21 and at gate 28 of MOSFET 25 having gate input capacity 38. When this voltage exceeds the threshold voltage of MOSFET 25, the impedance between relay output terminals 31–32 changes from a high to low value, assuming that MOSFET 25 is of an enhancement variety.

The turn-on time of the prior art circuit is, for the most part, limited by the rate at which photovoltaic diode string 17 can charge gate-substrate capacity 38 of the MOSFET 25. The turn-off time is determined primarily by the RC time constant of capacity 38 and shunt discharge resistance 21. In prior art devices, fixed shunt resistance 21 has typically been of the order of 15 Meg-Ohms, which in combination with the relatively large capacitance of the gate terminal of a power MOSFET produces a decay time constant of the order of one millisecond. Using a smaller value of shunt resistance 21 is not practicable in the prior art circuits because lower values of resistance undesirably reduce the output voltage of photovoltaic diode string 17, reducing the drive to MOSFET 25, and adversely affecting the turn-on. Thus, comparatively slow switching times, especially turn-off times have continued to be a problem.

Figure 2A:
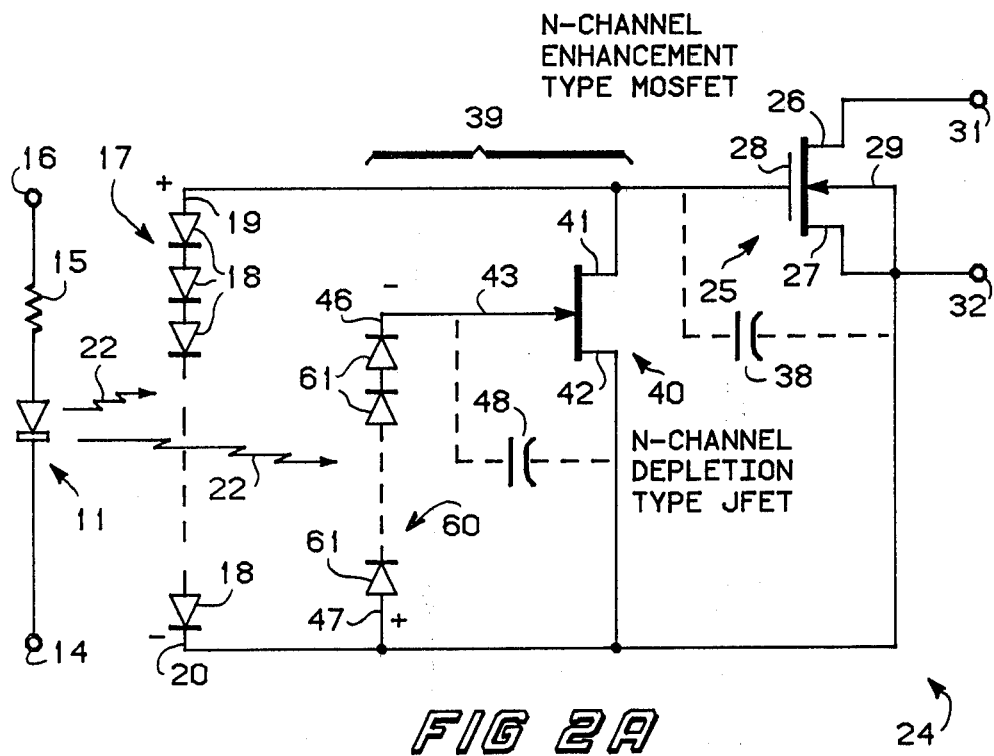
FIG. 2A is a schematic diagram of one embodiment of a solid state relay in accordance with the present invention.

In FIG. 2A, solid state relay 24, according to the present invention, includes LED 11, first photovoltaic diode string 17, and MOSFET 25 as in the prior art. (Circuit elements in FIGS. 2A–B which are similar to those of FIGS. 1A–B are denoted by the same members.) Solid state relay 24 further includes variable shunt discharge resistance 39 which comprises junction field effect transistor (JFET) 40 having drain 41, source 42, and control (gate) terminal 43, and photovoltaic diode string 60 composed of individual diodes 61. Drain terminal 41 of JFET 40 is connected to control terminal 28 of field effect transistor 25, and reference (source) terminal 42 of transistor 40 is connected to reference terminal 29. Photovoltaic diode string 60 is connected at one end to control gate 43 of transistor 40 and at the other end to the common line joining substrate terminal 29 of transistor 25, photovoltaic string 17 and reference (source) terminal 42 of transistor 40. Photovoltaic diode strings 17 and 60 are disposed in proximity to LED 11 so that light 22 emitted by LED 11 intercepts photovoltaic diode strings 17 and 60. MOSFET 25 has internal control terminal (gate) capacity 38 and JFET 40 has internal control terminal (gate) capacity 48.

The circuit of FIG. 2A is illustrated for the case wherein transistor 25 is of an N-channel enhancement type MOSFET and transistor 40 is an N-channel depletion type JFET. For this illustrative choice of transistors 25 and 40, photovoltaic diode strings 17 and 60 will have the polarity shown on FIG. 2A wherein terminal 19 of photovoltaic diode string 17 is positive, terminal 20 of photovoltaic diode string 17 is negative, terminal 46 of photovoltaic diode string 60 is negative, and terminal 47 of photovoltaic diode string 60 is positive. Terminal 19 is connected to control terminal (gate) control 28 of transistor 25 and to terminal 41 of transistor 40. Terminal 46 is connected to terminal (gate) 43 of transistor 40. Terminals 20 and 47 are coupled together and tied to reference terminal 29 of transistor 25 and common terminal (source) 42 of transistor 40. It will be noted that when photovoltaic diode strings 17 and 60 are under constant illumination, that the voltages generated and applied to the control terminals of transistors 25 and 40 are of opposite polarity. This combination of polarities ensures that transistor 40 will be in a high impedance state in the presence of illumination from LED 11 (when it is desired to maintain a voltage at terminal 28 of transistor 25), and in a low impedance state in the absence of radiation from LED 11 when it is desired to remove the voltage from terminal 28 of device 25.

It will be recognized by those of skill in the art that transistor 25 may be of either N or P-channel, of either enhancement or depletion type and of either MOSFET or JFET type. Correspondingly, transistor 40 may likewise be of either N-channel or P-channel type. Transistor 40 may also be either a MOSFET or JFET type device, but must always be of depletion type or equivalent.

The channel types of transistors 25 and 40 can be selected independently. As will be recognized by those of skill in the art, the polarity of photovoltaic diode string 17 must be selected to correspond with the selection of transistor 25. In a similar fashion, the polarity of photovoltaic diode string 60 and the point of connection of terminal 47 will be determined by the choice of transistor 40. No matter what the choice, the connections must be arranged so that transistor 40 is in its low impedance state in the absence of light falling on diode strings 17 and 60, and in its high impedance state in the presence of light falling on diode strings 17 and 60.

Figure 2B:
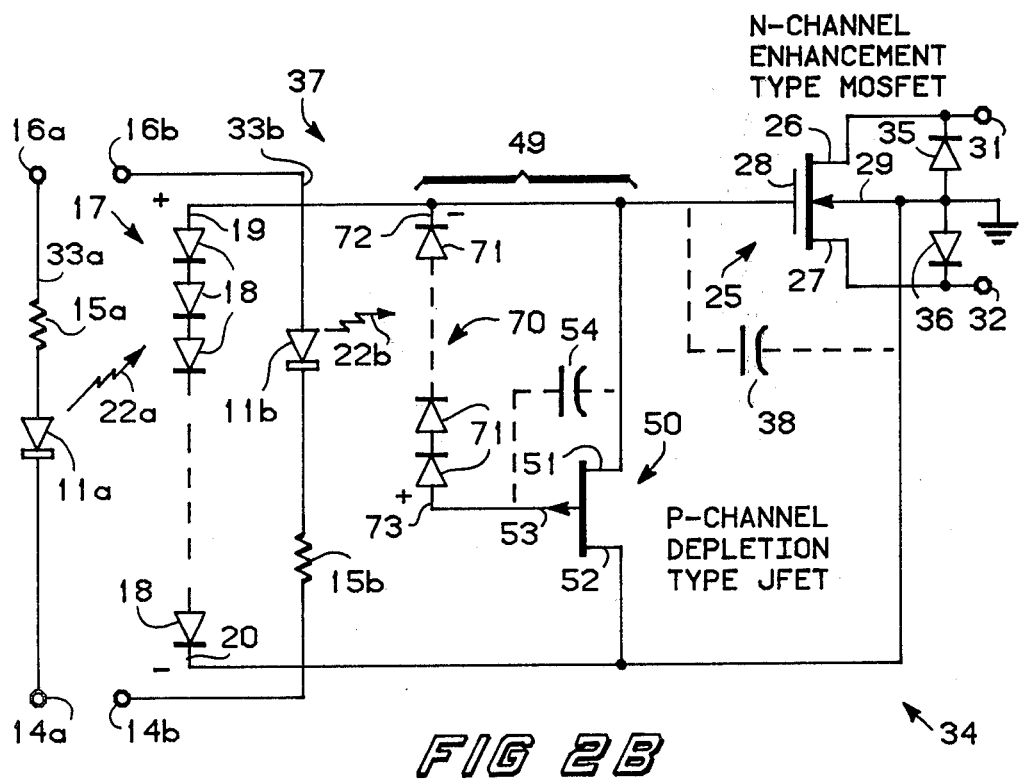
FIG. 2B is a schematic diagram of another embodiment of a solid state relay in accordance with the present invention.

FIG. 2B is a schematic diagram of an alternative embodiment of the present invention and also illustrates the use of a P-channel JFET as the variable shunt discharge resistance. Solid state relay 34 has separate input circuits 33a-b comprising LED's 11a-b, current limiting resistors 15a-b and input terminals 14a-b and 16a-b. Photosensitive device portion 37 has photovoltaic diode string 17 composed of photovoltaic diode 18, photovoltaic diode string 70 composed of photovoltaic diodes 71, P-channel depletion-type JFET 50, and MOSFET 25. Variable shunt discharge resistance 49 comprises photovoltaic diode string 70 and JFET 50. Anode 19 of diode string 17 is connected to control (gate) electrode 28 of transistor 25. Cathode terminal 20 of photodiode string 17 is connected to reference terminal (substrate) 29 of transistor 25. Anode 73 of photovoltaic diode string 70 is connected to control (gate) terminal 53 of JFET 50. Control (gate) terminal 53 of JFET 50 has internal capacity 54. Cathode terminal 72 of photovoltaic diode string 70 is connected to control (gate) 28 of transistor 25 and anode 19 of photovoltaic diode string 17. Source terminal 51 of JFET 50 is likewise connected to control terminal 28 and anode 19. Drain 52 of P-channel JFET 50 is connected to reference electrode 29 and cathode 20 of photovoltaic diode string 17. Current carrying terminals 26 and 27 of transistor 25 are connected to output terminals 31 and 32, respectively, as in FIG. 2A. Reference electrode 29 is connected to the common point of diodes 35 and 36 as in FIG. 1B. This connection is suitable for use when the external signal desired to be modulated by solid state relay 34 is of an ac type. The LED's and photodiode strings are arranged so that light 22a emitted by LED 11a falls on photovoltaic diode string 17 and light 22b emitted by LED 11a falls on photovoltaic diode string 70. FIG. 2B illustrates the modifications necessary in the connection of the circuit of FIG. 2A in order to use a P-channel type JFET as the variable resistance discharge device. It will be noted that the polarity of connection and the common point of photovoltaic diode string 70 has been modified over FIG. 2A in order to accommodate the polarity requirements of P-channel JFET 50 as compared to N-channel JFET 40 of FIG. 2A. Modifications of polarity of photovoltaic diode string 17 and 70 to accommodate use of a P-channel type MOSFET for device 25 will be readily apparent to those of skill in the art.

The following is a description of the operation of the circuit of FIG. 2A. In the absence of light from LED 11 (or another source), N-channel depletion type JFET 40 is in its low impedance state so that control gate 28 is substantially clamped at the potential of reference electrode 29. Where device 25 is an N-channel enhancement type MOSFET this places device 25 in the high impedance or "off" state. When a control current is passed through terminals 14, 16 and resistor 15 so that LED 11 emits light 22, a first photovoltage is developed across photovoltaic diode string 17, anode 19 being positive and cathode 20 being negative. At the same time, light 22 from LED 11 also falls on photovoltaic diode string 60 and a second photovoltage is generated so that cathode 46 is negative and anode 47 is positive. These first and second photovoltages are applied, respectively, to control gates 28 and 43 of transistors 25 and 40. The voltage from diode string 60 applied to control gate 43 is sufficient to drive device 40 into its high impedance, or "off" state. With JFET 40 in a high impedance state, the photovoltage developed by diode string 17 can charge capacity 38 of control terminal 28 of transistor 25, raising the potential of control terminal 28 above the threshold for conduction, and, assuming an enhancement device, placing transistor 25 in its low impedance, or "on" state. Thus, supplying a control current to electrodes 14 and 16 has reduced the impedance between output terminals 31, 32 from a very high value (e.g. several megohms) to a very low value (e.g. several tenths of an ohm). Thus solid state relay and regulator 24 performs, without moving parts, the same functions as a mechanical relay. The on-state resistance presented between terminals 31-32 may be reduced to any arbitrarily small value by increasing the area of device 25. The circuit of FIG. 2A is more efficient than the prior art since there is negligible leakage current through the high impedance of JFET 40 in the off state.

When the control current passing through LED 11 is removed or the light input otherwise interrupted, photovoltaic diode strings 17 and 60 no longer provide driving voltages to control terminals 28 and 43. However, transistors 25 and 40 will remain in the on-state until capacitors 38 and 48, respectively, have been discharged. Typically, transistor 25 is desired to have at least 1,000 times the current-carrying capacity of transistor 40 and, thus, capacitor 38 can be larger than capacitor 48 by approximately the same factor. Since capacitor 48 is small it can rapidly discharge through the parasitic resistance of diode string 60 and the gate-source junction of transistor 40. Discharge times of the order of a microsecond or less are typical. Discharging capacitor 48 reduces the voltage on control gate 43 to zero and causes JFET depletion mode transistor 40 to revert to its low impedance state which, in turn, rapidly discharges capacitor 38 removing the voltage from control terminal 28 of transistor 25 and returning transistor 25 to its high impedance or "off" state. Thus, transistor 40 in conjunction with photovoltaic diode stack 60 provides a variable resistance discharge path which presents a high impedance when illuminated and rapidly switches to a low impedance when not illuminated, that is, when the control signal driving the LED or the external illumination is removed, thus hastening the turn-off of solid state relay 24 as compared to the prior art. An improvement in turn-off time of from approximately one millisecond of the prior art to approximately one microsecond is achieved with the present invention.

The operation of the circuit in FIG. 2B will now be explained. In FIG. 2B, two independent input control circuits having terminals 14a, 16a and 14b, 16b are provided, which independently couple light 22a and 22b to photovoltaic diode strings 17 and 70, respectively. This arrangement provides additional circuit flexibility, by allowing discharge transistor 50 to be turned on and off independently of the state of photovoltaic diode string 17. For example, LED 11a may be energized to illuminate photovoltaic diode string 17 so as to generate a voltage at anode 19. If LED 11b is simultaneously energized so as to illuminate photovoltaic diode string 70, then the circuit action will proceed substantially as described in connection with FIG. 2A, that is, transistor 50 will go to a high impedance state and transistor 25 will be turned on by the voltage from diode string 17 appearing at control electrode 28. However, if LED 11b is not simultaneously energized, then transistor 50 remains in its low impedance state, effectively short-circuiting photovoltaic diode string 17, and preventing any significant voltage buildup on control electrode 28. Thus, under these circumstances, enhancement mode transistor 25 will remain in the off (high impedance) state. No damage results from short-circuiting diode string 17 since the internal impedance of such a diode string is typically sufficiently high to limit the current flow to non-destructive values. Since both the turn-on and turn-off response time of JFET 50 are relatively rapid, LED 11b may be operated in a pulsed mode so that JFET 50 is alternatively switched between its high and low impedance states. By varying the repetition rate and on/off time of LED 11b while continuously energizing LED 11a to supply steady illumination to diode string 17, the voltage appearing at control electrode 28 of transistor 25 can be controlled to have substantially any value from approximately zero up to the maximum output voltage of photovoltaic diode stack 17. Alternatively, LED 11b can be energized continuously, preferably at a reduced level, and LED 11a pulsed. This permits the impedance presented between terminals 31 and 32 to be varied continuously over a wide range. Thus an analog variable impedance output can be derived directly from a pulsating or digital signal input to either control circuits 14a, 16a or 14b, 16b and steady input to the other. Thus the solid state relay 34 of FIG. 2B provides an inherent digital-to-analog conversion feature. It should be noted that the circuit of FIG. 2B can provide, in addition to the variable type analog output, an AND logic function in that both input circuits must be energized in order to obtain a low impedance output between terminals 31–32.

Thus, it will be apparent that there has been provided an improved solid state relay or regulator having improved switching characteristics, especially a reduced turn-off time, having an active discharge resistance in the form of a depletion type field effect device coupled to a separate photovoltaic diode string, having, if desired, a continuously varying output impedance, having inherent digital-to-analog conversion ability, and having the ability to perform AND type logic operations. Further, there has been provided a photosensitive device which can be (with the possible exception of the light source) readily integrated in a single semiconductor substrate or chip, and further which is of a high degree of flexibility in that both normally-on (depletion) and normally-off (enhancement) type behavior may be obtained at output terminals 31–32. A variety of device types can be utilized, including N-channel or P-channel enhancement or depletion devices of JFET or MOSFET types for the variable impedance output circuit, and N-channel or P-channel depletion devices of JFET or MOSFET types for the internal variable discharge resistance.

While particular embodiments of the invention have been shown and described, it will be understood that the invention is not limited thereto since many modifications can be made therein which will become apparent to those skilled in the art. For example, light from a wide variety of sources besides LED's can be used to activate the circuit, or the circuit can respond to light input directly. An electrical signal conditioning or logic function can also be added to the input circuit. Accordingly, it is intended to encompass all such variations which fall within the spirit and scope of the present invention.

I claim:

1. A photosensitive device exhibiting variable impedance between output terminals in response to light input, comprising:
   first photovoltaic means for producing a first voltage in response to a first light input from a first light source;
   second photovoltaic means for producing a second voltage in response to a second light input from a second light source different from said first light source;
   a first field effect transistor having a first control terminal and a first reference terminal, coupled to said first photovoltaic means and responsive to said first voltage, and further having a first variable impedance current-carrying pathway coupled between said output terminals, said variable impedance varying in response to said first voltage; and
   a second field effect transistor having a second control terminal and a second reference terminal coupled to said second photovoltaic means and responsive to said second voltage, and said second field effect transistor providing a second variable impedance current-carrying pathway coupled to said first control and reference terminals and wherein said second field effect transistor presents a high impedance in the presence of said second voltage and a low impedance in the absence of said second voltage.

2. The photosensitive device of claim 1 wherein said first field effect transistor is of an insulated gate type.

3. The photosensitive device of claim 1 wherein said second field effect transistor is of a junction gate type.

4. The photosensitive device of claim 2 wherein said first field effect transistor is of an enhancement type.

5. The photosensitive device of claim 2 wherein said first field effect transistor is of a depletion type.

6. The photosensitive device of claim 1 wherein said first and second photovoltaic means each comprise series connected photovoltaic diode strings.

7. An opto-electronic device having independent turn-on and turn-off input controls for varying the impedance between output terminals, comprising:
   a turn-on input light source;
   a turn-off input light source;
   first photovoltaic means for producing a first voltage in response to a first light input from said turn-on input light source;
   second photovoltaic means for producing a second voltage in response to a second light input from said turn-off input light source;
   a first field effect transistor having a first control terminal and a first reference terminal, coupled to said first photovoltaic means and responsive to said first voltage, and further having a variable impedance current-carrying pathway coupled between said output terminals, wherein said pathway is turned-on in the presence of said first voltage and turned-off when said first voltage is reduced below a threshold value for substantial conduction;
   a second field effect transistor having a second control terminal and a second reference terminal coupled to said second photovoltaic means and responsive to said second voltage, said second field effect transistor providing a variable impedance current-carrying connection across said first photovoltaic means for substantially short-circuiting said first photovoltaic means in the absence of said second voltage produced by light from said turn-off input light source, so as to reduce said first voltage below said threshold value.

8. The opto-electronic device of claim 7 wherein said first field effect transistor is of an insulated gate type and said second field effect transistor is of a junction gate type.

9. The opto-electronic device of claim 8 wherein said first and second photovoltaic means each comprise series connected photovoltaic diode strings.

10. An opto-electronic pulse-to-analogue converter comprising:
   a first input adapted to receive first pulses and having a first light source responsive to said first pulses;

a second pulsed input adapted to receive second pulses and having a second light source responsive to said second pulses;

a first photovoltaic means coupled to said first light source for producing a first unidirectional voltage in response to said first pulses;

a second photovoltaic means coupled to said second light source for producing a second unidirectional voltage in response to said second pulses;

storage capacitor means coupled across said first photovoltaic means for storing charge in response to said first voltage generated in response to said first pulses;

a first field effect transistor having a first control terminal and a first reference terminal connected across said first photovoltaic means, and further having a first variable impedance pathway coupled between output terminals which is responsive to said charge on said storage capacitor;

a second field effect transistor having a second control terminal and a second reference terminal connected across said second photovoltaic means, and providing a second variable impedance pathway connected across said first storage capacitor means which is responsive to said second voltage, for periodically discharging a portion of said charge on said storage capacitor means in response to said second pulses, so as to produce between said output terminals an analogue impedance responsive to the net charge on said storage capacitor means.

11. An opto-electronic logic gate comprising:

a first input having a first light source responsive to a first logic signal;

a second input having a second light source responsive to a second logic signal;

first photovoltaic means for producing a first voltage in response to a first light input from said first light source;

second photovoltaic means for producing a second voltage in response to a second light input from said second light source;

first field effect transistor means having control and reference terminals connected across said first photovoltaic means, and having a first current-carrying pathway which is responsive to said first voltage and which forms the logical output of said logic gate;

second field effect transistor means having control and reference terminals connected across said second photovoltaic means, and having a second current-carrying pathway which is responsive to said second voltage and which is connected across said first photovoltaic means for substantially short-circuiting said first voltage in response to said second logic signal.

* * * * *